(12) United States Patent
Gadat et al.

(10) Patent No.: US 9,391,644 B2
(45) Date of Patent: Jul. 12, 2016

(54) METHOD OF DECODING A CORRECTING CODE, FOR EXAMPLE A TURBO-CODE, BY ANALYSIS OF THE EXTENDED SPECTRUM OF THE WORDS OF THE CODE

(71) Applicant: THALES, Neuilly sur Seine (FR)

(72) Inventors: Benjamin Gadat, Toulouse (FR);
Nicolas Van Wambeke, Toulouse (FR);
Lionel Ries, Viviers les Montagnes (FR)

(73) Assignee: Thales, Courbevoie (FR)

( * ) Notice: Subject to any disclaimer, the term of this patent is extended or adjusted under 35 U.S.C. 154(b) by 107 days.

(21) Appl. No.: 14/285,160

(22) Filed: May 22, 2014

(65) Prior Publication Data
US 2014/0351667 A1  Nov. 27, 2014

(30) Foreign Application Priority Data
May 24, 2013 (FR) ..................................... 13 01181

(51) Int. Cl.
*H03M 13/37* (2006.01)
*H03M 13/29* (2006.01)

(52) U.S. Cl.
CPC ...... *H03M 13/3753* (2013.01); *H03M 13/2957* (2013.01); *H03M 13/3746* (2013.01)

(58) Field of Classification Search
CPC .................................................... H04L 1/0009
USPC .......... 714/774, 752, 758, 782, 756, 755, 704
See application file for complete search history.

(56) References Cited

U.S. PATENT DOCUMENTS

| | | | | |
|---|---|---|---|---|
| 8,301,984 B1 * | 10/2012 | Zhang | ............... | H03M 13/1128 714/780 |
| 8,347,195 B1 * | 1/2013 | Varnica | ............. | H03M 13/1117 714/752 |
| 8,677,225 B1 * | 3/2014 | Weiner | ................ | G06F 11/1012 714/800 |
| 8,938,660 B1 * | 1/2015 | Varnica | ................. | H03M 13/00 714/755 |
| 8,949,697 B1 * | 2/2015 | Chang | ............... | H03M 13/1515 708/492 |
| 2011/0072330 A1 * | 3/2011 | Kolze | ................ | H03M 13/1515 714/758 |

FOREIGN PATENT DOCUMENTS

WO    2011091845 A1    8/2011

OTHER PUBLICATIONS

Evangelos Papagiannis, et al., "Approaching the ML Performance with Interactive Decoding", 2004 International Zurich Seminar on Communications, Feb. 18, 2004, pp. 220-223, IEEE, Piscataway, NJ, USA, XP010697709.

(Continued)

*Primary Examiner* — Fritz Alphonse
(74) *Attorney, Agent, or Firm* — Baker & Hostetler LLP

(57) ABSTRACT

An improved decoding method is provided making it possible to solve the problem of the error floor of a turbo-code or of an LDPC code, or more generally of a correcting code from the family of "turbo-like codes", while preserving the same spectral efficiency, without any decrease in the useful throughput of the encoded stream. This result is obtained by an identification, on input to the decoder, of the bits on which an error has a strong impact, and a modification of the likelihoods corresponding to these bits so as to improve the convergence of the decoder.

14 Claims, 3 Drawing Sheets

(56) References Cited

OTHER PUBLICATIONS

Youssouf Ould-Cheikh-Mouhamedou, et al., "A Method of Lowering Turbo code Error Flare Using Correction Impulses and Repeated Decoding", 6th International ITG-Conference on Source and Channel Coding, Apr. 3, 2006, six (6) pages, URL:http://ieeexplore.ieee.org/ielx5/5755587/05755908.pdf?tp=&arnumber=5755908&isnumber=5755588, XP055095610.

Jingyu Kang, et al, "An Iterative Decoding Algorithm with Backtracking to Lower the Error-Floors of LDPC Codes", IEEE Transactions on Communications, Jan. 1, 2011, pp. 64-73, vol. 59, No. 1, IEEE Service Center, Piscataway, NJ, USA, XP011341754.

Mats Oberg, et al., "Application of Distance Spectrum Analysis to Turbo Code Performance Improvement", International Symposium on Turbo Codes and Related Topics, Sep. 3, 1997, pp. 1-10, XP002251688.

Claude Berrou, et al., "Computing the Minimum Distance of Linear Codes by the Error Impulse Method", IEEE Global Telecommunications Conference Proceedings, Nov. 17-21, 2002, pp. 1017-1020, vol. 2, IEEE, New York, NY, USA, XP010636299.

Steward Crozier, et al., "Estimating the Minimum distance of Turbo-codes Using Double and Triple Impulse Mehtods", IEEE Communications Letter, Jul. 2005, pp. 631-633, vol. 9, No. 7.

Roberto Garello, et al., "The All-Zero Iterative Decoding Algorithm for Turbo Code Minimum distance Computation", IEEE Communications Society, 2004, pp. 361-364.

Joachim Hagenauer, "The Exit Chart—Introduction to Extrinsic Information Transfer in Iterative Processing", EUSIPCO, 2004, eight (8) pages.

\* cited by examiner

METHOD OF DECODING A CORRECTING CODE, FOR EXAMPLE A TURBO-CODE, BY ANALYSIS OF THE EXTENDED SPECTRUM OF THE WORDS OF THE CODE

CROSS-REFERENCE TO RELATED APPLICATION

This application claims priority to foreign French patent application No. FR 1301181, filed on May 24, 2013, the disclosure of which is incorporated by reference in its entirety.

FIELD OF THE INVENTION

The invention relates to a method of decoding a correcting code by analysis of the spectrum of the words of the code and advantageously applies to a correcting code from the family of turbo-codes.

BACKGROUND

The known algorithms for decoding the correcting codes from the family of turbo-codes exhibit limitations from the point of view of the post-decoding bit error rate performance at high signal-to-noise ratio. Indeed, it is known that beyond a threshold value of signal-to-noise ratio, the post-decoding bit error rate of a turbo-code cannot be improved with a standard decoding algorithm. This phenomenon is known by the term "error floor" which characterizes the minimum level of the bit error rate below which it is not possible to improve performance.

This phenomenon, well known in the field, is related to the fact that certain code words exhibit a minimum distance, that is to say a distance in relation to the closest code word, which is low. Now, the minimum distance has a direct impact on the code correcting power. If a code word received is at a distance of less than the minimum distance from the code word transmitted, then the decoder definitely converges to the right code word. On the contrary, the more significant the distance between the code word received and the code word transmitted, the more difficult the convergence of the decoder.

Several procedures are known for solving the problem of the error floor of the correcting codes from the family of turbo-codes.

A first solution consists in adding an outer code, for example a BCH code or a Reed-Solomon code to form a concatenated scheme. This technique makes it possible to improve the decoding performance by eliminating the error floor phenomenon but exhibits the defect of decreasing the spectral efficiency or the useful throughput of the transmission. Indeed, the overall rate of the two concatenated codes is less than the turbo-code rate alone.

A second solution, proposed in publication [1], consists in analysing the spectrum of the words of the code so as to identify the least protected bits in the frame of the code. Indeed it is known that in these codes, not all the bits are protected in an equitable manner. Therefore the impact of an error on a given bit is not the same as that of an error on the neighbouring bit. Once the set $\Omega$ of these bits has been determined, a turbo coder inserts known bits at the positions signified by the set $\Omega$. Consequently, during decoding, the set $\Omega$ as well as the values of the inserted bits being known, significant reliability is declared on input to the turbo-decoder so as to improve the performance thereof. The inserted bits are thereafter removed on output from the turbo-decoder so as to retrieve the information frame.

This solution also presents the defect of decreasing the effective rate of the code since bits are added by the coder thereby decreasing the number of useful bits for a given information frame size.

A third solution, proposed in document [2] consists in introducing pulses at given positions in the frame. These positions are determined on the basis of the items of information regarding likelihood of the bits on input to the decoder. These items of information are sorted as a function of their magnitude solely and the pulses are introduced one by one, beginning with the least reliable likelihoods.

This solution has the defect of being very complex. Indeed, it appears to be effective solely for a large number of positions and relies on the principle that all the bits in the frame have the same significance, this not being true for a turbo-code.

SUMMARY OF THE INVENTION

The invention proposes an improved decoding method making it possible to solve the problem of the error floor of a turbo-code or of an LDPC code, or more generally of a correcting code from the family of "turbo-like codes", while preserving the same spectral efficiency, that is to say without any decrease in the useful throughput of the encoded stream. This result is obtained through an identification, on input to the decoder, of the bits on which an error has a strong impact, and a modification of the likelihoods corresponding to these bits so as to improve the convergence of the decoder.

The subject of the invention is an iterative method of decoding a code word received from a correcting code, the said code word being represented by an item of information regarding local likelihood of each bit of which it consists, the said iterative method being characterized in that it comprises the following steps:

a step of analysing the extended spectrum of the words of the code to generate a table containing, for each bit of a code word, an item of information regarding distance between the said code word and the code word obtained by decoding and then re-encoding the said code word for which the value of a bit is erroneous, For each bit of index i of a subset of the bits of the code word received, executing in an iterative manner the following steps:

A step of decoding the said code word received,

A step of calculating an item of information regarding overall likelihood IM(i) of the decoded code word, A step of comparing the item of information regarding overall likelihood IM(i) calculated at the current iteration with the item of information regarding overall likelihood IM(i−1) calculated at the previous iteration, A step of modifying the amplitude and the sign of the item of information regarding local likelihood LLR(i) of a bit of index i of the said code word received, the selected index i corresponding to that index of the said table which is associated with the lowest distance in the table, from among the indices not selected at a previous iteration, If the item of information regarding overall likelihood IM(i) calculated at the current iteration is less than the item of information regarding overall likelihood IM(i−1) calculated at the previous iteration, a step of reinitializing the item of information, modified at the previous iteration, regarding local likelihood LLR(i−1) of the said bit of index i−1 of the said code word received.

According to a particular embodiment, the method according to the invention furthermore comprises a step of testing stopping of the method.

When the decoding step is iterative, the stopping test can be a test on the number of iterations of the decoding step.

The stopping test can also be a test of convergence of the decoding step.

The convergence test comprises, for example, the detection of an error in the result of the decoding step by application of an error-detecting code (CRC).

The convergence test comprises, for example, the comparison of the item of information regarding overall likelihood IM(i) with a predetermined threshold value.

The item of information regarding overall likelihood IM(i) is, for example, an item of mutual information or is equal to the inverse of the Euclidian distance between the decoded and then re-encoded code word and the code word received.

According to a particular aspect of the invention, the said subset of the bits of the code word received is equal to the entirety of the bits of the code word received or to a subset consisting of the bits whose local likelihood LLR exhibits an absolute value below a predetermined threshold.

According to a particular aspect of the invention, the step of analysing the extended spectrum comprises the following sub-steps:

Selecting a code word,
For each bit of the said code word, executing in an iterative manner the following steps:
Modifying the value of the said bit,
Decoding the modified code word,
Encoding the result of the decoding,
Calculating a distance between the result of the encoding and the modified code word.

According to a particular aspect of the invention, the correcting code is a turbo-code or an LDPC code.

The subject of the invention is also a computer program comprising instructions for the execution of the iterative method of decoding according to the invention, when the program is executed by a processor, a recording medium readable by a processor on which is recorded a program comprising instructions for the execution of the iterative method of decoding according to the invention, when the program is executed by a processor and a device comprising means adapted for executing the steps of the method according to the invention.

BRIEF DESCRIPTION OF THE DRAWINGS

Other characteristics and advantages of the present invention will become more apparent on reading the description which follows in relation to the appended drawings which represent.

DETAILED DESCRIPTION

The invention is aimed notably at improving the performance of the standard methods of decoding of the turbo-codes or of correcting codes of the same family.

Figure 1:
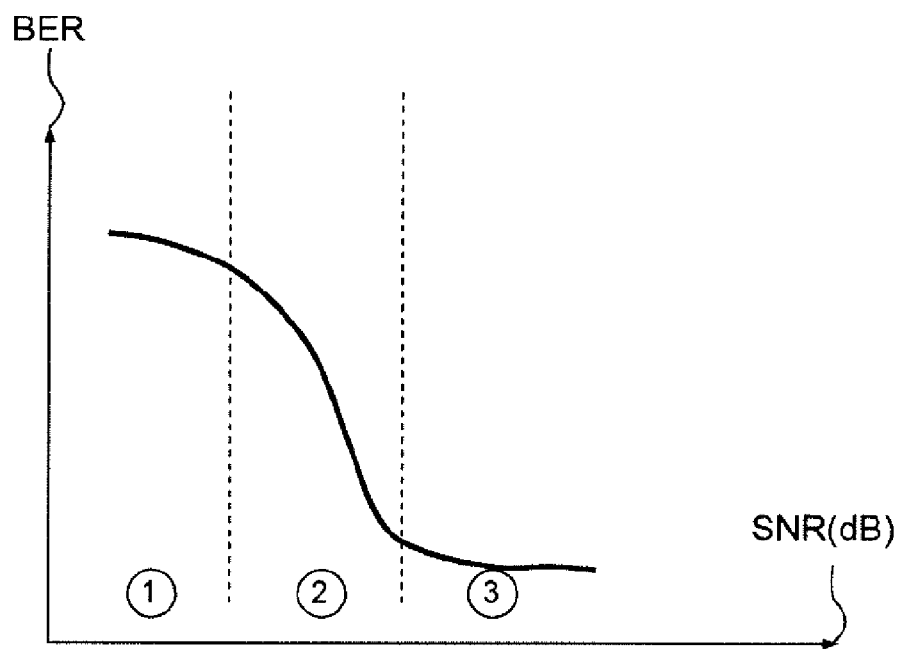
FIG. 1, a chart of the theoretical performance of a correcting code from the family of turbo-codes, in terms of error rate dependent on the signal-to-noise ratio, illustrating the limitations of the standard decoding procedures, FIG. 2, a diagram illustrating the notion of minimum distance of a correcting code, FIG. 3, a flowchart illustrating the steps of implementing the decoding method according to the invention, FIG. 4, a flowchart detailing, in an exemplary embodiment, the sub-steps of implementation of the step of analysing the extended spectrum of the code words.

FIG. 1 represents a chart of the theoretical performance of a correcting code from the family of turbo-codes. The abscissa SNR corresponds to the signal-to-noise ratio expressed in decibels and the ordinate BER corresponds to the bit error rate.

The curve of characteristic bit error rate of a turbo-code comprises, as is well known in the field, three zones 1, 2, 3 which can be distinguished as a function of the signal-to-noise ratio. The first zone 1 is a zone where the bit error rate saturates at a maximum value on account of too low a signal-to-noise ratio. The second zone 2 is a zone where the bit error rate decreases rapidly with the increase in the signal-to-noise ratio. The third zone 3 is a so-called "floor" zone which corresponds to a maximum signal-to-noise ratio beyond which the decoder attains a bit error rate limit below which it no longer succeeds in improving the decoding.

An objective of the invention is to resolve the effect of the "floor" zone of a turbo-code without impacting the spectral efficiency.

The problem of the floor zone at large signal-to-noise ratio is intrinsically related to the low-order code words, that is to say to the code words lying a small distance d from another code word.

Figure 2:
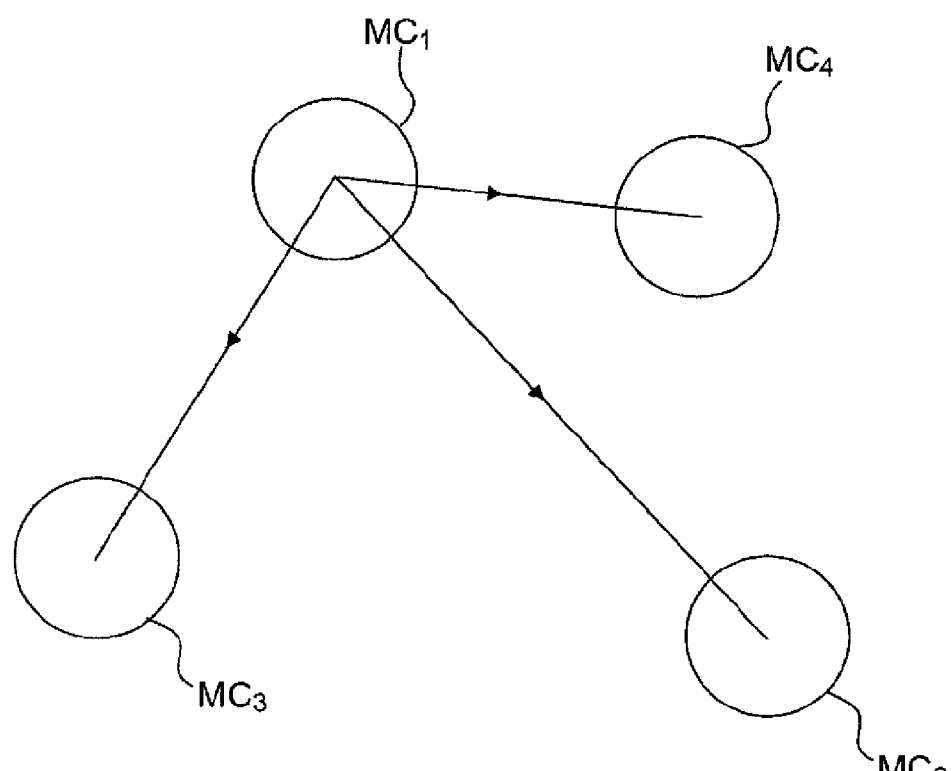

FIG. 2 illustrates the notion of distance between several code words. In the example of FIG. 2, the code word MC1 is of lower order than the code word MC2 since its minimum distance, that is to say the smallest distance to another code word, is lower than that of the code word MC2.

Figure 3:
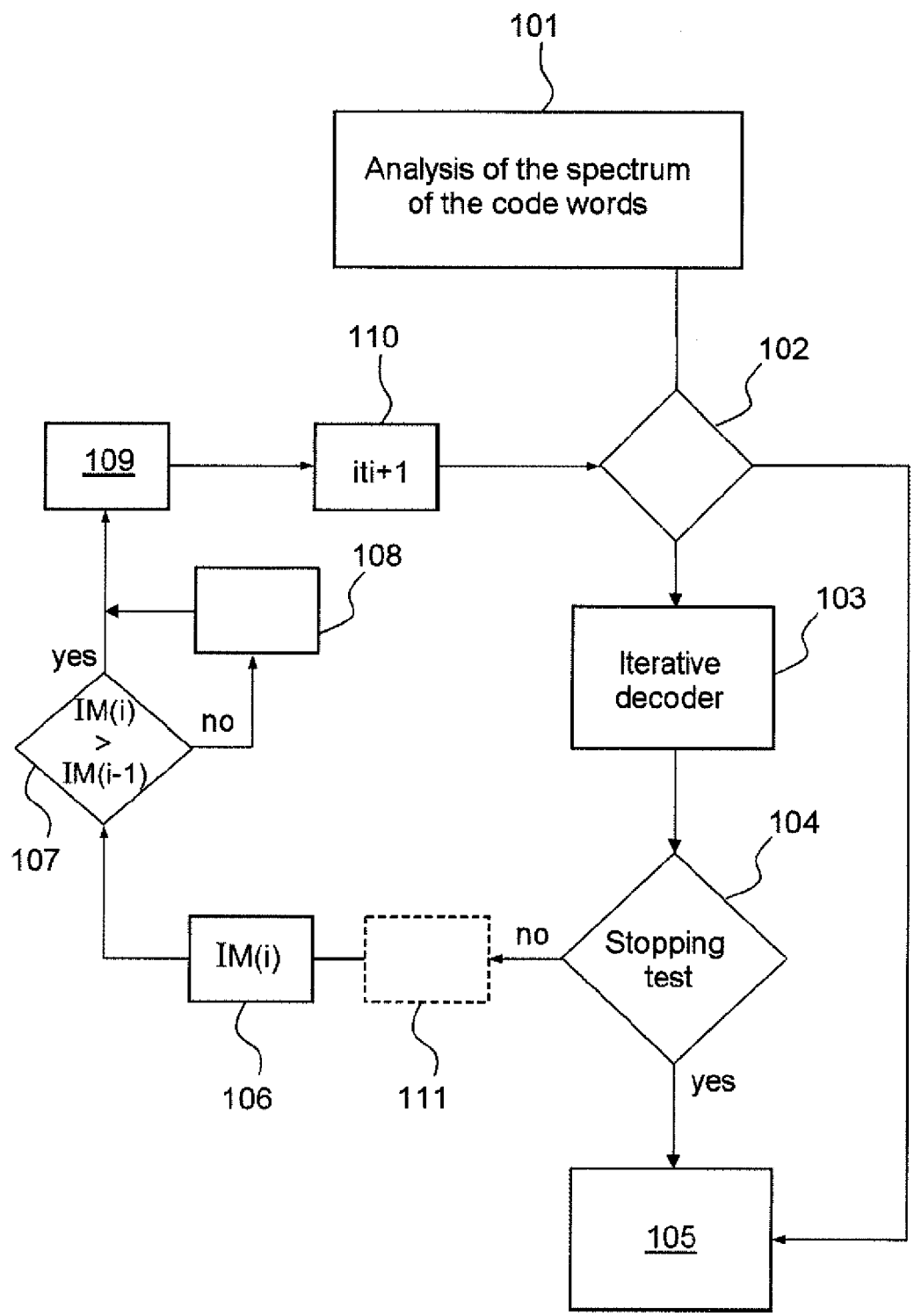

FIG. 3 illustrates, in a flowchart, the steps of implementation of the decoding method according to the invention.

The method according to the invention consists in carrying out the decoding of at least one code word by a correcting code from the family of turbo-codes. The invention also applies to LDPC (Low Density Parity Check) codes or to any code said to be from the family of "turbo like codes", stated otherwise correcting codes constructed on the basis of graphs and which are decoded in an iterative manner.

A code word is defined by a first vector of size N containing the bits or symbols received and a second vector, subsequently denoted LLR, of the same size N, containing an item of information about the reliability or the likelihood of the bits or symbols received. For example, this item of information can be defined by a likelihood ratio or "log-likelihood ratio" which constitutes a flexible (that is to say not binary) item of information giving an indication about the reliability of the bit received. For example, the higher the magnitude of a value LLR, the higher the probability that there is no error in the corresponding bit. The sign of the value LLR defines the corresponding bit (0 or 1) according to the constellation of the modulation chosen.

A code word input to the decoding method according to the invention may have been subjected to disturbances, for example related to the imperfections of the transmission channel, which give rise to errors in the bits received and in the likelihood information LLR.

An objective of the invention is to improve the post-decoding error rate with respect to the standard decoding procedures.

The first step 101 of the method is a step preliminary to the decoding and can be executed separately from the decoding itself. It consists in carrying out an analysis of the extended spectrum of the words of the correcting code.

The analysis of the spectrum of a correcting code consists in determining the distribution of the words of the code as a function of their distance from another code word. The minimum distance of a code word is the smallest distance between this code word and the other code words of the alphabet of the correcting code considered. The distance most commonly used is the Hamming distance, stated otherwise the number of different bits between two code words.

Various techniques are known for carrying out an analysis of the spectrum of a correcting code, among which are those described in publications [3], [4] and [5].

The first step 101 of the method consists in determining the extended spectrum of the correcting code. More precisely, this entails, for each code word, setting one of the bits of the word to an erroneous value and calculating the distance between this code word and the same modified code word decoded and then recoded.

Stated otherwise, for a code word of size N, the analysis of the extended spectrum leads to the generation of N distances, each corresponding to the same code word but in which one of the bits is erroneous. The distance is calculated after decoding of the code word, a bit of which is intentionally forced to an incorrect value, by calculating the Hamming distance between the decoded word obtained and then recoded and the initial code word.

Figure 4:
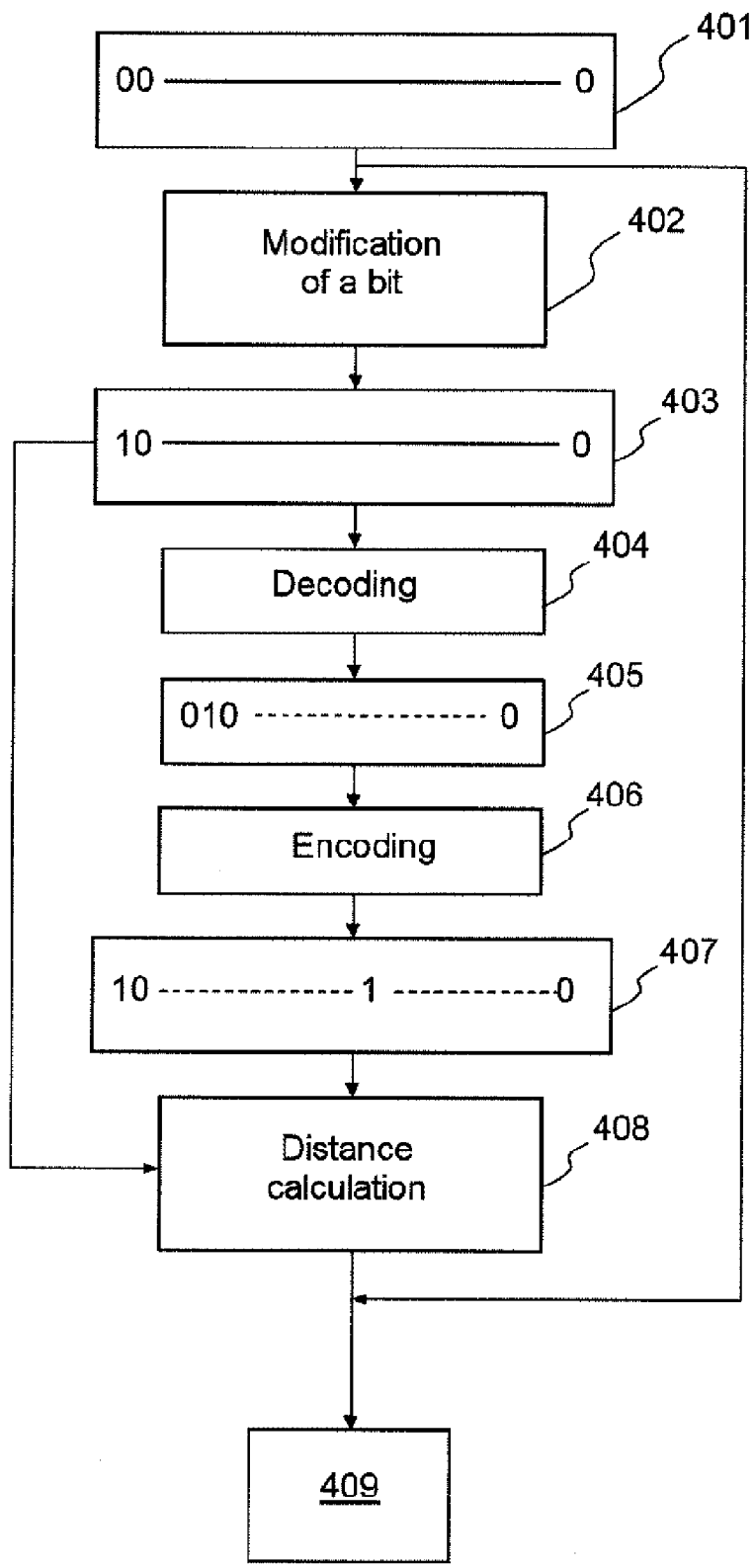

FIG. 4 details, according to an exemplary embodiment, the sub-steps of step 101 of analysing the extended spectrum of the code words.

The flowchart of FIG. 4 shows diagrammatically the sub-steps required for the analysis of the extended spectrum for a given code word. The steps represented must be repeated for the whole set of code words or a subset of this set.

The sub-steps of step 101 comprise notably a first step of selecting a code word 401. Advantageously, the chosen code word 401 is the code word comprising all its bits at 0. But the chosen code word 401 can be any of the words of the code. The analysis of the extended spectrum can be performed only for this single code word 401 since the correcting code used is a linear code and consequently the properties of the code words are identical and transposable from one code word to another. It is therefore unnecessary to apply the steps described in FIG. 4 for several different code words 401.

The code word 401 thereafter undergoes a modification 402 of one of its bits, stated otherwise the value of this bit is inverted.

The modified code word 403 is thereafter decoded 404, preferably using the same decoder as that used by the decoding method according to the invention. A decoded word 405 is thus obtained, which is thereafter again encoded 406 to obtain a new code word 407. This new code word 407 is thereafter compared with the initial code word 401 by calculating a Hamming distance 408 between the two code words and which is stored in a file 409 or a memory.

Steps 402 to 408 are repeated while modifying one by one each of the bits of the code word 401 so as ultimately to obtain an array 409 indicating for each bit index, the Hamming distance between the code word obtained when the corresponding bit is erroneous and the correct code word. This Hamming distance is an item of information about the impact of an error on a code word as a function of the erroneous bit.

In a variant embodiment, to limit the calculation time required, the analysis of the extended spectrum is carried out on a subset of the bits of the code word 401, seeking solely the bits in which an error gives rise to a decoded word 407 that is a predetermined threshold distance away from the original word 401.

The implementation of step 101 of analysing the extended spectrum can be carried out once and for all by using the same iterative decoding algorithm as that used to carry out the decoding according to the invention.

Step 101 culminates in the generation of a table 409, which can be stored, for example in a file or a database, containing, for each bit index of a code word, an associated distance.

The description of the steps of the decoding method according to the invention such as illustrated in FIG. 3 is now continued.

The decoding method according to the invention is an iterative method which receives as input a vector of the bits received and an associated vector containing the items of information regarding likelihood of the bits received and produces as output a decoded vector and an associated vector also containing the items of information regarding likelihood of the decoded bits.

In a first iteration, a standard decoding 103 is applied, for example an iterative decoding.

In a step 104, a stopping test is carried out to stop the decoding 103 when the latter has converged or before convergence so as to limit the complexity.

This stopping test can be carried out via at least one of the following procedures or by using several of these procedures taken in combination.

A first stopping test consists in using an error-detecting code of the CRC (Cyclic Redundancy Check) type to protect the data before coding. A detection test is performed after decoding 103 to verify whether the code word obtained is correct. The decoding 103 is iterated as long as the decoding of the CRC is not positive so as to test the convergence of the decoder.

A second stopping test consists in fixing a stopping criterion at the decoder 103 as a function of the number of iterations, stated otherwise in fixing a maximum number of iterations beyond which the decoding 103 is stopped.

A third stopping test consists in calculating a decoding output overall likelihood criterion 103 and in comparing this criterion with a threshold. An overall likelihood criterion is an indication of the reliability of the decoding on a code word. For example, it can entail a value lying between 0 and 1, the value 0 corresponding to totally erroneous decoding (with an error rate of 50%) and the value 1 corresponding to correct decoding (with an error rate of 0%). An exemplary overall likelihood calculation consists in calculating a mutual information criterion such as described in publication [6]. The third stopping test can consist in stopping the decoding 103 when the overall likelihood criterion is greater than a threshold value, for example a value equal to 0.9.

Generally, other stopping tests are possible, notably based on detecting the convergence of the decoding 103, that is to say the stopping of the changes in the decoding, so as to stop the decoding when it no longer changes its decision.

If the convergence test 104 is positive, stated otherwise if the decoding 103 has converged to a decision, this decision is considered to be the final decision 105, it consists of the decoded binary vector and of a second vector containing an item of information regarding local likelihood of each decoded bit.

The production of items of information regarding local likelihoods at decoding output requires the use of a decoder able to receive as input flexible items of information (as opposed to binary items of information) and to generate as output flexible items of information, such a decoder is known in the field of correcting codes by the term SISO (Soft Input Soft Output) decoder.

If the stopping test 104 is negative, for example if the decoding 103 has not converged to a stable decision, then a new iteration of the method according to the invention is triggered.

In a step 106, an overall likelihood criterion IM(i) is calculated on the basis of the vector of the items of information regarding local likelihoods of the decoded bits. This criterion can be an item of mutual information as indicated in publication [6] or can be calculated by other equivalent means. In particular the overall likelihood criterion can also be equal to the inverse of a calculation of Euclidian distance between the decoded and then recoded vector and the vector input to the decoding method. For example, this Euclidian distance calculation can be carried out with the aid of the following relation: $D = \sum_{i=0}^{N-1} \sqrt{(R_i - X_i)}$, with N the size of the code word, $R_i$ the local likelihoods associated with the bits of the code word produced on input to the iterative decoding 103 and $X_i$ the bits of the code word obtained by re-encoding the vector obtained as output from the iterative decoding 103.

In a test step 107, the overall likelihood criterion IM(i) calculated for the current iteration i is compared with the overall likelihood criterion IM(i−1) calculated for the previous iteration i−1. Of course, this test is applied only onwards of the second iteration (i=2).

If the overall likelihood criterion IM(i) calculated for the current iteration is greater than the overall likelihood criterion IM(i−1) calculated for the previous iteration i−1 or if the iteration is the first (i=1) then a step 109 of modifying the input vector of the items of information regarding local likelihoods is undertaken.

According to this modifying step 109, an index of the input vector is selected and the value corresponding to this index is modified by a value of sign opposite to the initial value and of amplitude at least equal to the minimum distance of the correcting code considered.

To determine the index to be selected, a search for the index corresponding to the lowest Hamming distance is conducted in the table 409 generated on completion of the extended spectrum analysis step 101. This index corresponds to the bit which if it is erroneous will be the most difficult for the decoder to correct. Indeed, in the error floor zone, it may be noted that the errors made by an iterative decoder are often due to so-called low-order code words, stated otherwise code words which comprise few different bits with respect to the original code word. By modifying the value of the bits (with the aid of a pulse) which are naturally the least protected by the actual structure of the code, it is thus possible to succeed in circumventing the error floor phenomenon. If this index has already been used during a previous iteration of the method it is no longer eligible, the selected index is then the one associated with the lowest distance, from among the still eligible indices.

If the overall likelihood criterion IM(i) calculated for the current iteration is less than or equal to the overall likelihood criterion IM(i−1) calculated for the previous iteration i−1 and if the iteration is different from the first (i≠1), then, in an additional step 108, the value modified in the input vector at the previous step i−1 is reinitialized to its original value.

Steps 106, 107, 108, 109 are repeated 110 and a test 102 is applied to verify that the entirety of the values of the input vector have been modified by step 109 in which case the decoding method is finalized with the decision 105 obtained during the last iteration.

In a variant embodiment of the invention, an additional step 111 is executed when the stopping test 104 is negative and as a preliminary to the overall likelihood calculation step 106. This additional step 111 consists in selecting a subset of the values of the decoder input vector LLR, this subset consisting of the lowest local likelihood values, which correspond to the bits most apt to be erroneous.

The iterations on the indices of the input vector LLR are thereafter undertaken solely on this subset, with the goal of limiting the complexity of the algorithm as well as its execution time.

The decoding method according to the invention can be implemented on the basis of hardware elements and/or software elements. It can notably be implemented in the guise of computer program comprising instructions for its execution. The computer program can be recorded on a recording medium readable by a processor.

It can be used in a context of transmission of a stream of coded data between a transmitter and a receiver, the method according to the invention being implemented in the receiver.

It can also be executed on the basis of a stream of data which is coded and stored in a storage device.

The various steps of the method according to the invention can also be executed by a device comprising a processor and a memory. The processor can be a generic processor, a specific processor, an application specific integrated circuit (ASIC) or an array of in situ programmable gates (FPGA standing for "Field-Programmable Gate Array").

REFERENCES

[1] M. Oberg & P. Siegel, "Application of distance spectrum analysis to turbo code performance improvement", Proc. 35th Annu. Conf. Commun, Control and Computing. pp 701-710, Sep. 1997.
[2] Y. Ould-Cheikh-Mouhamedou, "A Method for Lowering Turbo Code Error Flare using Correction Impulses and Repeated Decoding", $6^{th}$ international ITG-Conference on Source and Channel Coding (Turbocoding), 2006 $4^{th}$ international symposium on
[3] C. Berrou and S. Vaton, Computing the minimum distance of linear codes by the error impulse method, proc. of IEEE ISIT, 2002
[4] S. Crozier et al, Estimating the Minimum Distance of Turbo-Codes using double and Triple Impulse Methods, IEEE Comm. Letters, 2005
[5] R. Garello and A. Vila, The All-zero iterative decoding algorithm for turbo code minimum distance computation, in proc of IEEE ICC, 2004.
[6] J. Hagenauer, The Exit Chart—Introduction to Extrinsic Information Transfer in iterative Processing, in Proc. of 12th Europ. Signal. Proc. (EUSIPCO), 2004.

The invention claimed is:

1. A computer-implemented iterative method for decoding a received code word from a correcting code, the code word being represented by a local likelihood value for each bit of the code word, the iterative method comprising the following steps executed by a processor and a memory:

analysing an extended spectrum of words of the correcting code to generate a table containing, for each bit of a code word, an information regarding distance between the code word and the code word obtained by decoding and then re-encoding the code word for which a value of a bit is erroneous, and for each bit of index i of a subset of bits of the code word received, executing in an iterative manner the following steps:

decoding the received code word, calculating an overall likelihood value IM(i) for the decoded code word, comparing, onwards of a second iteration (i=2), the overall likelihood value IM(i) calculated at a current iteration with an overall likelihood value IM(i−1) calculated at a previous iteration, modifying an amplitude and a sign of a local likelihood value LLR(i) for a bit of index i of the received code word, the selected index i corresponding to that index of the table which is associated with a lowest distance in the table, from among indices not selected at a previous iteration, onwards of the second iteration (i=2), if the overall likelihood value IM(i) calculated at the current iteration is less than the overall likelihood value IM(i−1) calculated at the previous iteration, reinitializing the local likelihood value LLR(i−1) of the bit of index i−1 of the received code word that was modified at the previous iteration.

2. The iterative method of claim 1, further comprising a stopping test.

3. The iterative method of claim 2, in which the decoding step is iterative and the stopping test is a test on the number of iterations of the decoding step.

4. The iterative method of claim 2, in which the stopping test is a test of convergence of the decoding step.

5. The iterative method of claim 4, in which the convergence test comprises a detection of an error in a result of the decoding step by application of an error-detecting code.

6. The iterative method of claim 4, in which the convergence test comprises a comparison of the overall likelihood value IM(i) with a predetermined threshold value.

7. The iterative method of claim 1, in which the overall likelihood value IM(i) is a mutual information.

8. The iterative method of claim 1, in which the overall likelihood value IM(i) is equal to an inverse of an Euclidian distance between the decoded and then re-encoded code word and the received code word.

9. The iterative method of claim 1, in which the subset of the bits of the received code word is equal to the entirety of the bits of the received code word or to a subset consisting of bits with a local likelihood value LLR that is below a predetermined threshold.

10. The iterative method of claim 1, in which analysing the extended spectrum comprises:
    selecting a code word,
    for each bit of the code word, executing in an iterative manner the following:
    modifying the value of the bit,
    decoding the modified code word,
    encoding the result of the decoding, and
    calculating a distance between the result of the encoding and the modified code word.

11. The iterative method of claim 1, in which the correcting code is a turbo-code or an LDPC code.

12. A computer program comprising instructions stored on a tan non-transitory storage medium for executing on a processor an iterative method for decoding a received code word from a correcting code, the code word being represented by a local likelihood value for each bit of the code word, the iterative method comprising:
    analysing an extended spectrum of words of the correcting code to generate a table containing, for each bit of a code word, an information regarding distance between the code word and the code word obtained by decoding and then re-encoding the code word for which the value of a bit is erroneous, and
    for each bit of index i of a subset of bits of the code word received, executing in an iterative manner the following steps:
    decoding the received code word,
    calculating an overall likelihood value IM(i) for the decoded code word,
    comparing, onwards of a second iteration (i=2), the overall likelihood value IM(i) calculated at a current iteration with an overall likelihood value IM(i−1) calculated at a previous iteration,
    modifying an amplitude and a sign of a local likelihood value LLR(i) for a bit of index i of the received code word, the selected index i corresponding to that index of the table which is associated with a lowest distance in the table, from among indices not selected at a previous iteration,
    onwards of the second iteration (i=2), if the overall likelihood value IM(i) calculated at the current iteration is less than the overall likelihood value IM(i−1) calculated at the previous iteration, reinitializing the local likelihood value LLR(i−1) of the bit of index i−1 of the received code word that was modified at the previous iteration.

13. A tangible non-transitory processor-readable recording medium on which is recorded a program comprising instructions for executing an iterative method for decoding a received code word from correcting code, the code word being represented by a local likelihood value for each bit of the code word, the iterative method comprising:
    analysing an extended spectrum of words of the correcting code to generate a table containing, for each bit of code word, an information regarding distance between the code word and the code word obtained by decoding and then re-encoding the code word for which the value of a bit is erroneous, and
    for each bit of index i of a subset of bits of the code word received, executing in an iterative manner the following steps:
    decoding the received code word,
    calculating an overall likelihood value IM(i) for the decoded code word,
    comparing, onwards of a second iteration (i=2), the overall likelihood value IM(i) calculated at a current iteration with an overall likelihood value IM(i−1) calculated at a previous iteration,
    modifying an amplitude and a sign of a local likelihood value LLR(i) for a bit of index i of the received code word, the selected index i corresponding to that index of the table which is associated with a lowest distance in the table from a on indices not selected at a previous iteration,
    onwards of the second iteration (i=2), if the overall likelihood value IM(i) calculated at the current iteration is less than the overall likelihood value IM(i−1) calculated at the previous iteration, reinitializing the local likelihood value LLR(i−1) of the bit of index i−1 of the received code word that was modified at the previous iteration.

14. A device comprising a processor and a memory configured for executing an iterative method for decoding a received code word from a correcting code, the code word being represented by a local likelihood value for each bit of the code word, the iterative method comprising:
    analysing an extended spectrum of words of the correcting code to generate a table containing, for each bit of a code word, an information regarding distance between the code word and the code word obtained by decoding and then re-encoding the code word for which the value of a bit is erroneous, and
    for each bit of index i of a subset of bits of the code word received, executing in an iterative manner the following steps:
    decoding the received code word,
    calculating an overall likelihood value IM(i) for the decoded code word, comparing, onwards of a second iteration (i=2), the overall likelihood value IM(i) calculated at a current iteration with an overall likelihood value IM(i−1) calculated at a previous iteration, modifying an amplitude and a sign of a local likelihood value LLR(i) for a bit of index i of the received code word, the selected index i corresponding to that index of the table which is associated with a lowest distance in the table, from among indices not selected at a previous iteration, onwards of the second iteration (i=2), if the overall likelihood value IM(i) calculated at the current iteration is less than the overall likelihood value IM(i−1) calculated at the previous iteration, reinitializing the local likelihood value LLR(i−1) of the bit of index i−1 of the received code word that was modified at the previous iteration.

\* \* \* \* \*